(12) United States Patent
Tong et al.

(10) Patent No.: US 9,230,995 B2
(45) Date of Patent: Jan. 5, 2016

(54) ARRAY SUBSTRATE, MANUFACTURING METHOD THEREOF AND DISPLAY DEVICE

(71) Applicant: BOE TECHNOLOGY GROUP CO., LTD., Beijing (CN)

(72) Inventors: Xiaoyang Tong, Beijing (CN); Zhanfeng Cao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 191 days.

(21) Appl. No.: 13/824,764

(22) PCT Filed: Nov. 13, 2012

(86) PCT No.: PCT/CN2012/084537
§ 371 (c)(1),
(2) Date: Mar. 18, 2013

(87) PCT Pub. No.: WO2013/143294
PCT Pub. Date: Oct. 3, 2013

(65) Prior Publication Data
US 2014/0125901 A1    May 8, 2014

(30) Foreign Application Priority Data
Mar. 29, 2012  (CN) .......................... 2012 1 0088834

(51) Int. Cl.
*G02F 1/136* (2006.01)
*H01L 27/12* (2006.01)
*G02F 1/1368* (2006.01)

(52) U.S. Cl.
CPC .......... *H01L 27/1225* (2013.01); *G02F 1/1368* (2013.01); *H01L 27/124* (2013.01); *G02F 2001/13685* (2013.01)

(58) Field of Classification Search
CPC ................... G02F 1/1368; G02F 2001/16385; G02F 2001/13685; H01L 27/1274; H01L 27/1225; H01L 27/124
See application file for complete search history.

(56) References Cited

U.S. PATENT DOCUMENTS

| 2004/0165121 A1* | 8/2004 | Tsujimura et al. ............. 349/42 |
| 2006/0092342 A1 | 5/2006 | Lee |

(Continued)

FOREIGN PATENT DOCUMENTS

| CN | 1499643 A | 5/2004 |
| CN | 1925135 A | 3/2007 |

(Continued)

OTHER PUBLICATIONS

International Preliminary Report on Patentability Appln. No. PCT/CN2012/084537; Dated Oct. 1, 2014.

(Continued)

*Primary Examiner* — Michael Caley
(74) *Attorney, Agent, or Firm* — Ladas & Parry LLP

(57) ABSTRACT

Embodiments of the present application relate to an array substrate, the manufacturing method thereof and a display device. The array substrate comprises: a substrate, of gate lines and of data lines, a plurality of pixel units, defined by the gate lines and the data lines, each of the pixel units comprising a thin film transistor and a pixel electrode, wherein the thin film transistor comprises a source electrode, a drain electrode, an active layer, a gate insulating layer and a gate electrode, and the source electrode and the drain electrode are provided on the substrate opposing to each other with a channel of the thin film transistor provided therebetween, and the pixel electrode is positioned in a region outside the thin film transistor within the pixel unit, and is extended to a position above the drain electrode to be partly lapped over and directly connected to the drain electrode.

7 Claims, 2 Drawing Sheets

(56) References Cited

U.S. PATENT DOCUMENTS

| | | | |
|---|---|---|---|
| 2007/0146566 A1* | 6/2007 | Hosoya | 349/43 |
| 2008/0136986 A1* | 6/2008 | Kim et al. | 349/40 |
| 2009/0021664 A1* | 1/2009 | Yamazaki | 349/47 |
| 2009/0174835 A1* | 7/2009 | Lee et al. | 349/46 |
| 2010/0295049 A1 | 11/2010 | Yoo et al. | |

FOREIGN PATENT DOCUMENTS

| | | |
|---|---|---|
| CN | 1945811 A | 4/2007 |
| CN | 101894807 A | 11/2010 |
| CN | 102244034 A | 11/2011 |
| CN | 102629611 A | 8/2012 |

OTHER PUBLICATIONS

Second Chinese Office Action dated Jul. 15, 2014; Appln. No. 201210088834.3.
First Chinese Office Action dated Dec. 30, 2013; Appln. No. 201210088834.3.
International Search Report; Feb. 14, 2013; PCT/CN2012/084537.

* cited by examiner

ARRAY SUBSTRATE, MANUFACTURING METHOD THEREOF AND DISPLAY DEVICE

BACKGROUND

Embodiments of the present application generally relate to an array substrate, a manufacturing method thereof and a display device.

Recently, the liquid crystal display technology has been improved continuously. A thin film transistor liquid crystal display (TFT-LCD) has predominated in the display field because of various advantages of excellent image quality, low energy consumption, eco-friendliness and the like.

There has always been a demand in increasing the size of a liquid crystal display. With increasing of the size of the liquid crystal display, it is required for frequency of a driving circuit thereof to be increased and in turn, mobility of an amorphous silicon transistor is also required to increase. However, mobility of a current amorphous silicon transistor is generally about 0.5 $cm^2/V \cdot S$, and in the case of the size of the liquid crystal display larger than 80 inches and driving frequency of 120 Hz, mobility of 1 $cm^2/V \cdot S$ or more is required, and thus, it is impossible for the current amorphous silicon transistor to meet the requirement of the mobility.

A thin film transistor (TFT) substrate comprising an active layer made of a metal oxide (such as, an IGZO and the like) may better meet requirements of a large size liquid crystal display and an active organic light emitting display because of advantages of high mobility, good homogeneity and the like of the metal oxide, thus attracting much attentions and becoming a research focus in recent years.

Conventionally, a structure of the TFT substrate comprising the active layer made of a metal oxide (such as, IGZO and the like) comprises: a gate electrode layer, a gate insulating layer, an active layer and a source/drain electrode layer (i.e., the source electrode and the drain electrode) sequentially positioned on a glass substrate. Such structure is generally formed by a wet etching process. An etchant used in the wet etching process is typically $H_2SO_4$, $H_3PO_4$ or $H_2O_2$. In such acid etchant environment, the metal oxide itself is easily to be etched, or over-etched. Therefore, a barrier layer provided above the active layer is required to be additionally added in the current TFT substrate, to prevent the metal oxide active layer from being etched and thus being destroyed in the case of using a wet etching process to form the source/drain electrode, thereby further improving performance of the TFT substrate. However, an additional single lithography process is required to form such added barrier layer, which may complicate the manufacturing process of the TFT substrate and thus increasing the production cost of the TFT substrate.

SUMMARY

Embodiments of the present application provide an array substrate, a manufacturing method thereof and a display device, which is capable of omitting an additional barrier layer added in a current array substrate for preventing a metal oxide active layer, such as, an IGZO active layer from being destroyed, and thus, simplifying the manufacturing process of the array substrate, improving the production efficiency, decreasing the production cost and the like.

In one aspect, an embodiment of the present application provides an array substrate, comprising: a substrate, a plurality of gate lines and a plurality of data lines, crossing each other and formed on the substrate, respectively; a plurality of pixel units, disposed on the substrate and defined by the plurality of gate lines and the plurality of data lines crossing each other, each of the plurality of pixel units comprising a thin film transistor and a pixel electrode, wherein the thin film transistor comprises a source electrode, a drain electrode, an active layer, a gate insulating layer and a gate electrode, and the source electrode and the drain electrode are provided on the substrate opposing to each other with a channel of the thin film transistor provided therebetween, the active layer is provided above the substrate on which the source electrode and the drain electrode are formed, the gate insulating layer and the gate electrode are sequentially provided above the active layer, and the pixel electrode is positioned in a region outside the thin film transistor within the pixel unit, and is extended to a position above the drain electrode to be partly lapped over and directly connected to the drain electrode.

Alternatively, the active layer has the same size and shape as those of the gate insulating layer, and the gate insulating layer is positioned directly above the active layer.

Alternatively, the pixel electrode only laps over and directly connects to a part of the drain electrode adjacent to the pixel electrode, one part of the active layer positioned above the drain electrode is directly lapped over and connected to the drain electrode and the other part thereof is connected to the drain electrode via the pixel electrode.

Alternatively, the active layer is made of an oxide semiconductor.

Alternatively, the array substrate further comprises a protection layer provided above the gate electrode.

In another aspect, an embodiment of the present application also provides a display device comprising the above-mentioned array substrate.

Yet another aspect, an embodiment of the present application further provides a manufacturing method of an array substrate, comprising:

Step S1, forming pattern including a source electrode and a drain electrode on a substrate by a first patterning process;

Step S2, forming pattern including a pixel electrode on the substrate after the step S1 by a second patterning process, and the pixel electrode is partly lapper over and directly connected to the drain electrode;

Step S3, forming pattern including an active layer and a gate insulating layer on the substrate after the step S2 by a third patterning process;

Step S4, forming pattern including a gate electrode on the substrate after the step S3 by a fourth patterning process.

Alternatively, the step S3 comprises: sequentially depositing an active layer thin film and a gate insulating layer thin film; and simultaneously forming the active layer and the gate insulating layer by one same patterning process using a mask, and size and shape of the active layer are identical to those of the gate insulating layer.

Alternatively, in the step S2, the pixel electrode is made to be lapped over and connected to only a part of the drain electrode adjacent to the pixel electrode; and in the step S3, one part of the active layer positioned above the drain electrode is directly lapped over and connected to the drain electrode and the other part thereof is connected to the drain electrode via the pixel electrode.

Alternatively, the active layer is made of an oxide semiconductor.

Alternatively, after the step S4, the manufacturing method of the array substrate further comprises a step S5 in which a protection layer is formed on the substrate after the step S4 by a fifth patterning process.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

FIGS. 1a-1f are structural schematic views of an array substrate during formation according to an embodiment of the present application, wherein FIG. 1f is a final structural schematic view of the array substrate according to the embodiment of the present application.

DETAILED DESCRIPTION

In order to make objects, a technical solution and advantages of embodiments of the present application more apparent, the technical solutions of the embodiments will be described in a clearly and fully understandable way in connection with the drawings related to the embodiments of the present application. It is obvious that the described embodiments are just a part but not all of the embodiments of the invention. Based on the described embodiments herein, those skilled in the art can obtain other embodiment(s), without any inventive work, which should be within the scope of the invention.

It should be noted that, in the embodiments of the present application, a patterning process refers to a lithography process comprising coating, exposing, developing, etching, removing of the photoresist and the like. The source/drain electrode refers to a source electrode and a drain electrode.

Figure 1A:
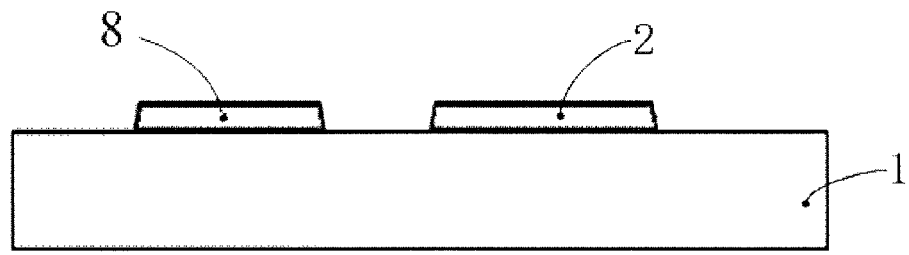
Figure 1B:
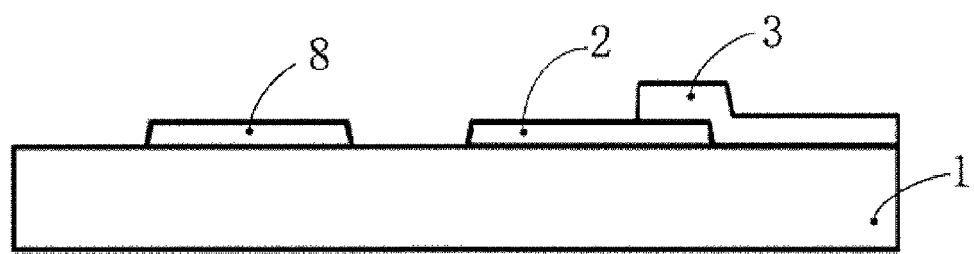
Figure 1C:
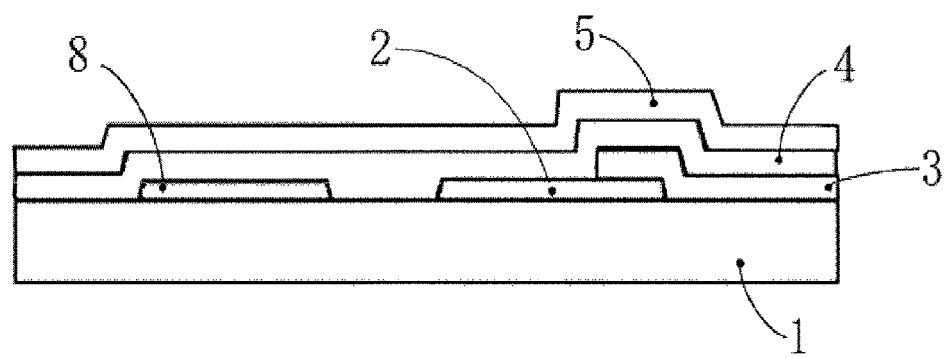
Figure 1D:
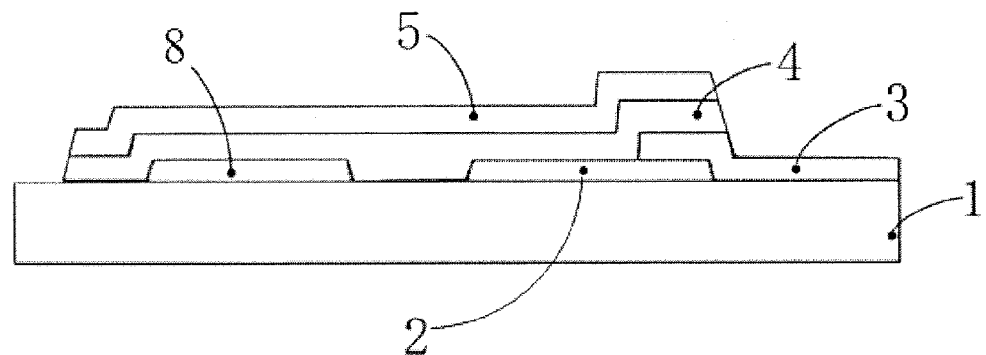
Figure 1E:
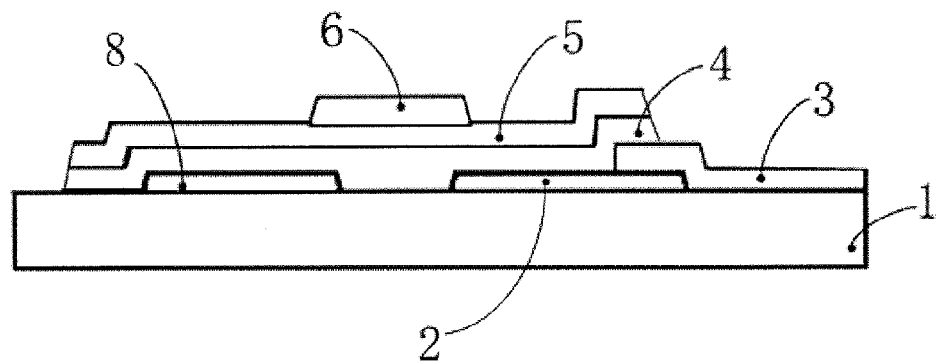
Figure 1F:
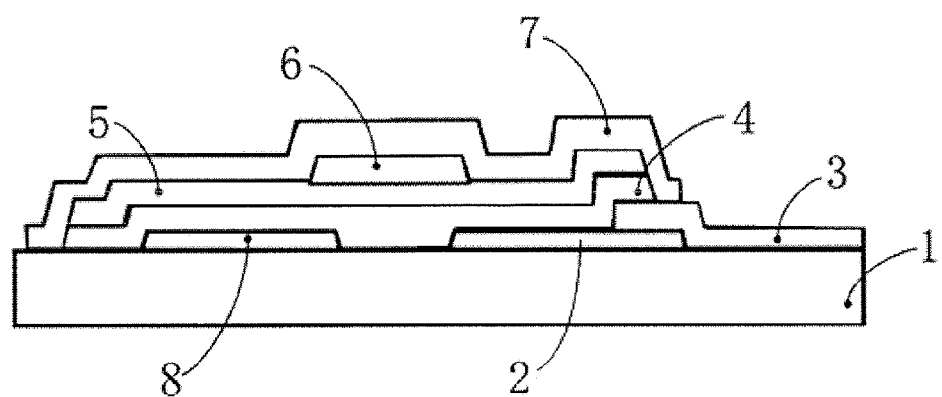

As shown in FIG. 1f, an embodiment of the present application provides an array substrate, comprising: a substrate 1; a plurality of gate lines and data lines(not shown) crossing each other; and a plurality of pixel units, positioned on the substrate 1, defined by the gate lines and the data lines crossing each other and arranged into a matrix, and wherein each of the pixel units comprises a thin film transistor as a switching element and a pixel electrode 3, and the thin film transistor comprises a source electrode 8, a drain electrode 2, an active layer 4, a gate insulating layer 5 and a gate electrode 6. The source electrode 8 and the drain electrode 2 are provided on the substrate 1 opposing to each other with a channel of the thin film transistor provided therebetween ; the active layer 4 is provided above the substrate 1 on which the source electrode 8 and the drain electrode 2 are formed, and forming the channel of the thin film transistor; the gate insulating layer 5 and the gate electrode 6 are sequentially provided above the active layer 4; the pixel electrode 3 is formed in a region outside the thin film transistor within the pixel unit, and is extended to a position above the drain electrode 2 to be partly lapped over and directly connected to the drain electrode 2.

Alternatively, the active layer 4 is of the same size and shape as the gate insulating layer 5, and the gate insulating layer 5 is provided directly above the active layer 4. Keeping such shape and position relationship may make manufacturing of the active layer 4 and the gate insulating layer 5 in the same one patterning process, thereby decreasing the number of manufacturing processes. Of course, the active layer 4 may have shape and size different from the gate insulating layer 5, for example, the active layer 4 has area larger than that of the gate insulating layer 5, and in such case, the two layers are required to be manufactured by using different patterning processes.

Alternatively, as shown in FIG. 1f, the pixel electrode 3 only laps over and directly connects to a part of the drain electrode 2 adjacent to the pixel electrode 3, one part of the active layer 4 positioned above the drain electrode 2 is directly lapped over and connected to the drain electrode 2 and the other part thereof is connected to the drain electrode 2 via the pixel electrode 3. A metal used to manufacture the drain electrode usually has a higher conductivity than material used to manufacture the pixel electrode, so such design may ensure a better electrical contact between the active layer and the drain electrode, thereby leading to the better electrical property of the thin film transistor. Of course, the pixel electrode 3 may also fully cover the drain electrode 2, and the active layer is connected with the drain electrode via the pixel electrode 3. In such case, properties of the device are slightly inferior to that according to the preferred embodiment.

The active layer 4 of the present embodiment is made of an oxide semiconductor, preferably made of metal oxide IGZO material. On the other hand, the pixel electrode 3 may be made of a transparent conductive material, such as ITO (Indium Tin Oxides).

In addition, the array substrate may further comprise a protection layer 7, which is provided above the gate electrode 6 to protect the above mentioned structures (as shown in FIG. 1f). Of course, the protection layer 7 is only used to better protect the device, such as a thin film transistor, thus may or may not be provided.

In an embodiment of the present application, the pixel electrode 3 is partly lapped over and directly connected to the drain electrode 2 so that the two electrodes is directly connected to each other, and thus, an additional step of forming a through hole for communication on the drain electrode 2 can be omitted, simplifying the manufacturing process and increasing the productivity. In the array substrate of the present embodiment, the active layer 4 may be provided above the source electrode 8 and the drain electrode 2 to effectively prevent the active layer from being destroyed during forming of the source/drain electrode, thus not requiring a barrier layer provided to protect the metal oxide (such as, an IGZO and the like) active layer in a current technology, thereby simplifying the manufacturing process, improving the productivity and decreasing the product cost.

It is to be understood by those skilled in the art that when the active layer is made of any other semiconductor material (such as, organic semiconductor, Si semiconductor) other than the oxide semiconductor, if the active layer is provided beneath the source/drain electrode as in the prior art, the active layer may be etched during forming of the source electrode and the drain electrode as the described in the above BACKGROUND part. Therefore, the above technical solution of the present embodiment may also be applied to other array substrate comprising an active layer made of any other semiconductor, such as, organic semiconductor, Si semiconductor or the like, to prevent the active layer from being destroyed.

Another embodiment of the present application provides a manufacturing process of an array substrate according to an embodiment of the present application, comprising:

Step S1, forming pattern including a source electrode and a drain electrode on a substrate by a first patterning process.

Specifically, referring to FIG. 1a, a metal layer is formed by a way, such as, evaporation or deposition, and a source electrode 8 and a drain electrode 2 are formed by a masking process, an exposing process, a developing process, an etching process, a removing process of a photoresist and the like using a common mask, and thicknesses of the source electrode 8 and the drain electrode 2 are 2500 Å.

Step S2, forming pattern including a pixel electrode 3 on the substrate after the step S1 by a second patterning process, and the pixel electrode 3 is partly lapped over and directly connected to the drain electrode 2.

The pixel electrode of the present embodiment may be made of a transparent conductive material, such as ITO (Indium Tin Oxides). As shown in FIG. 1b, exemplary steps comprises: depositing a transparent conductive material layer, such as, an ITO layer, on the substrate 1 after the step S1; forming the pixel electrode 3 by a masking process, an exposing process, a developing process, an etching process, a removing process of a photoresist and the like using a common mask, and the thickness of the pixel electrode 3 is 400Å and the pixel electrode 3 is partly lapped over and directly connected to the drain electrode 2. It is to be noted that, in the step, the pixel electrode 3 only laps over and directly connects to a part of the drain electrode 2 adjacent to the pixel electrode 3.

The pixel electrode 3 is partly lapped over and directly connected to the drain electrode 2 in order to directly connect the two electrodes, and thus, an additional step of forming a through hole for communication on the drain electrode 2 can be omitted, thus simplifying the manufacturing process and increasing the productivity.

Alternatively, the pixel electrode 3 may fully cover the drain electrode 2.

Step S3, fainting pattern including an active layer 4 and a gate insulating layer 5 on the substrate after the step S2 by a third patterning process.

The active layer 4 according to an embodiment of the present application is made of a metal oxide IGZO material. Referring to FIGS. 1c-1d, exemplary steps comprises: depositing an IGZO layer and an insulating layer (such as, a SiN layer) on the substrate after the step S2; and forming the pattern including the active layer 4 and the gate insulating layer 5 provided on the active layer 4 by a masking process, an exposing process, a developing process, an etching process, a removing process of a photoresist and the like using a common mask. In such case, the active layer 4 has the same size and shape as those of the gate insulating layer 5. However, the active layer 4 may have a different size from that of the gate insulating layer 5 as needed, for example, area of the active layer 4 may be larger than that of the gate insulating layer 5, and at this time, the two layers are required to be formed by using two different patterning processes or a dual-tone masking process (such as, a half-tone masking process or a gray-tone masking process).

Alternatively, in this step, corresponding to a way in which the pixel electrode 3 is only lapped over and directly connected to a part of the drain electrode 2 adjacent to the pixel electrode 3 in the step S2, one part of the active layer 4 positioned directly above the drain electrode 2 is directly lapped over and connected to the drain electrode 2, and the other part thereof is indirectly connected to the drain electrode 2 via the pixel electrode 3 by the third patterning process.

Alternatively, corresponding to a way in which the pixel electrode 3 completely covers the drain electrode 2 in the step S2, the active layer is connected to the drain 2 via the pixel electrode 3.

Step S4, forming pattern including a gate electrode on the substrate after the step S3 by a fourth patterning process.

As shown in FIG. 1e, exemplary steps comprises: depositing a gate metal thin film on the substrate after the step S3; and forming a gate electrode 6 by a masking process, an exposing process, a developing process, an etching process, a removing process of a photoresist and the like using a common mask, and the thickness of the gate electrode 6 is 2200 Å.

In order to better protect a device on the array substrate, the present embodiment further comprises:

Step S5, forming a protection layer on the substrate after the step S4 by a fifth patterning process.

As shown in FIG. 1f, exemplary steps comprises: depositing a protection layer thin film on the substrate after the step S4; and forming a protection layer 7 by a masking process, an exposing process, a developing process, an etching process, a removing process of a photoresist and the like using a common mask.

In an embodiment of the present application, the specific implementation of each step, especially a forming method and thickness of a film layer, are merely exemplary, thus are not limitative of the present application, and may be modified or selected by those skilled in the art as needed.

Thicknesses of the layers in the array substrate according to an embodiment of the present application may vary according to size of a liquid crystal display, thicknesses listed in the present embodiment are only exemplary thicknesses.

It should be understood by those skilled in the art that when the active layer is made of any other semiconductor material (such as, organic semiconductor or Si semiconductor) other than the oxide semiconductor, if the active layer is provided beneath the source/drain electrode as in the prior art, the active layer may be etched during forming of the source electrode and the drain electrode as the described in the above BACKGROUND part. Therefore, the above technical solution of the present embodiment may also be applied to other array substrate comprising an active layer made of any other semiconductor, such as, organic semiconductor, Si semiconductor or the like, to prevent the active layer from being destroyed.

In addition, an embodiment of the present application further provides a display device, comprising an array substrate according to an embodiment of the present application.

One example of the display device is a liquid crystal display device, wherein a TFT array substrate and an opposite substrate are disposed to face each other to form a liquid crystal cell, and liquid crystal material is filled in the liquid crystal cell. The opposite substrate is a color filter substrate, for example. A pixel electrode of each pixel unit of the TFT array substrate is used to apply an electric field, so as to control rotation of the liquid crystal material and to perform displaying operation. In some examples, the liquid crystal display device further comprises a backlight source provided for the array substrate.

Another example of the display device is an organic light emitting display (OLED) device, wherein a pixel electrode of each pixel unit of a TFT array substrate is used as an anode or a cathode to drive organic light-emitting material to emit light so as to perform a displaying operation.

The display device may also be a plasma display device or an electronic ink display device.

With regarding to an array substrate and a manufacturing method thereof according to embodiments of the present application, an active layer is provided above a source/drain electrode, thereby effectively preventing the active layer (in particular when the active layer is made of a metal oxide, such as, an IGZO and the like) from being destroyed during forming of the source/drain electrode. In addition, when the active layer is made of the metal oxide, a barrier layer used to protect the active layer in the conventional processes may be omitted, thereby simplifying the manufacturing process, increasing the productivity and decreasing the cost to the greatest degree. Furthermore, the source/drain electrode and the pixel electrode are made to directly contact with each other, an additional step of forming a through hole for communication can be omitted, thereby simplifying the manufacturing process and decreasing the production cost again.

The embodiment of the invention being thus described, it will be obvious that the same may be varied in many ways.

Such variations are not to be regarded as a departure from the spirit and scope of the invention, and all such modifications as would be obvious to those skilled in the art are intended to be included within the scope of the following claims.

What is claimed is:

1. An array substrate, comprising:
   a substrate,
   a plurality of gate lines and a plurality of data lines, crossing each other and formed on the substrate, respectively;
   a plurality of pixel units, disposed on the substrate and defined by the plurality of gate lines and the plurality of data lines crossing each other, each of the plurality of pixel units comprising a thin film transistor and a pixel electrode,
   wherein the thin film transistor comprises a source electrode, a drain electrode, an active layer, a gate insulating layer and a gate electrode, and the source electrode and the drain electrode are provided on the substrate opposing to each other with a channel of the thin film transistor provided therebetween,
   the active layer is provided above the substrate on which the source electrode and the drain electrode are formed
   the gate insulating layer and the gate electrode are sequentially provided above the active layer, and
   the pixel electrode is positioned in a region outside the thin film transistor within the pixel unit, and is extended to a position above the drain electrode to be partly lapped over and directly connected to the drain electrode,
   wherein an area of the active layer is larger than that of the gate insulating layer,
   wherein the pixel electrode only laps over and directly connects to a part of the drain electrode adjacent to the pixel electrode, one part of the active layer positioned above the drain electrode is directly lapped over and connected to the drain electrode and the other part thereof is connected to the drain electrode via the pixel electrode.

2. The array substrate according to claim 1, wherein the active layer is made of an oxide semiconductor.

3. The array substrate according to claim 1, further comprises a protection layer provided above the gate electrode.

4. A display device, comprising:
   an array substrate according to claim 1.

5. A manufacturing method of an array substrate, comprising:
   Step S1, forming pattern including a source electrode and a drain electrode on a substrate by a first patterning process;
   Step S2, forming pattern including a pixel electrode on the substrate after the step S1 by a second patterning process, and the pixel electrode is partly lapped over and directly connected to the drain electrode;
   Step S3, forming pattern including an active layer and a gate insulating layer on the substrate after the step S2 by a third patterning process;
   Step S4, forming pattern including a gate electrode on the substrate after the step S3 by a fourth patterning process,
   wherein an area of the active layer is larger than that of the gate insulating layer,
   wherein in the step S2, the pixel electrode is made to be directly lapped over and connected to only a part of the drain electrode adjacent to the pixel electrode; and
   in the step S3, one part of the active layer positioned above the drain electrode is directly lapped over and connected to the drain electrode and the other part thereof is connected to the drain electrode via the pixel electrode.

6. The manufacturing method of the array substrate according to claim 5, wherein the active layer is made of an oxide semiconductor.

7. The manufacturing method of the array substrate according to claim 5, after the step S4, further comprises a step S5 in which a protection layer is formed on the substrate after the step S4 by a fifth patterning process.

* * * * *